(12) United States Patent
Van Asma et al.

(10) Patent No.: US 6,313,679 B1
(45) Date of Patent: *Nov. 6, 2001

(54) TIMING CIRCUIT

(75) Inventors: Cornelis G. M. Van Asma; Matheus J. G. Lammers, both of Eindhoven (NL)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/294,860

(22) Filed: Apr. 20, 1999

(30) Foreign Application Priority Data

Apr. 20, 1998 (EP) .................................. 98201265

(51) Int. Cl.[7] .................................................. H03H 11/16
(52) U.S. Cl. ......................... 327/231; 327/158; 327/265; 327/273; 327/286
(58) Field of Search .................................... 327/263, 264, 327/265, 270, 273, 278, 279, 285, 286, 48, 156, 158, 166, 231; 331/19

(56) References Cited

U.S. PATENT DOCUMENTS

| | | | | |
|---|---|---|---|---|
| 3,619,699 | * | 11/1971 | Wheeler | 327/265 |
| 3,728,635 | * | 4/1973 | Eisenberg | 327/279 |
| 5,237,224 | * | 8/1993 | Delisle et al. | 327/276 |
| 5,506,531 | * | 4/1996 | Jang et al. | 327/156 |
| 5,815,043 | * | 9/1998 | Chow et al. | 331/57 |

* cited by examiner

*Primary Examiner*—Kenneth B. Wells
*Assistant Examiner*—Paul Dinh
(74) *Attorney, Agent, or Firm*—Bernard Franzblau

(57) ABSTRACT

A timing circuit which is used to synchronize different circuit to each other. The timing circuit includes adjustable delay apparatus which delay an input signal with a predetermined value. The timing circuit uses counting devices to count the input signal and the delayed output signal and thereby provides a simple and more cost effective timing circuit.

13 Claims, 3 Drawing Sheets

TIMING CIRCUIT

This invention relates to a timing circuit as described in the preamble of claim 1. The invention further relates to delay means for use in such a timing circuit. The invention further relates to a method for delaying a clock signal as described in the preamble of claim 5. The invention further relates to a display device comprising such a timing circuit.

Timing circuits having an adjustable delay are known, and can be used in a lot of different devices. For example, a timing circuit can be used in LCD projection.

These known timing circuits with adjustable delay have as a disadvantage that they cannot delay very high frequencies and/or do not offer a delay range sufficient to compensate for the total delay (for example, in an analog path) and/or are rather expensive.

It is, inter alia, an object of the invention to obtain a timing circuit and a method for delaying a timing signal that overcomes the drawbacks of the prior art.

To this end a first aspect of the invention provides a timing circuit as will be described below in detail. A second aspect of the invention provides a method of delaying a timing signal which also will be described below in detail.

An advantage of a timing circuit and a method for delaying a timing signal according to the invention is that it is possible to obtain a large clock delay range. Further, the clock delay can be made frequency independent. The timing circuit according to the invention can delay a clock signal with a very high frequency (for example, 200 MHz).

Embodiments of the invention are defined in the dependent Claims.

The invention and additional features, which may optionally be used to advantage, will be apparent from and elucidated with reference to the examples described below and shown in the attached drawing, in which.

Figure 1:
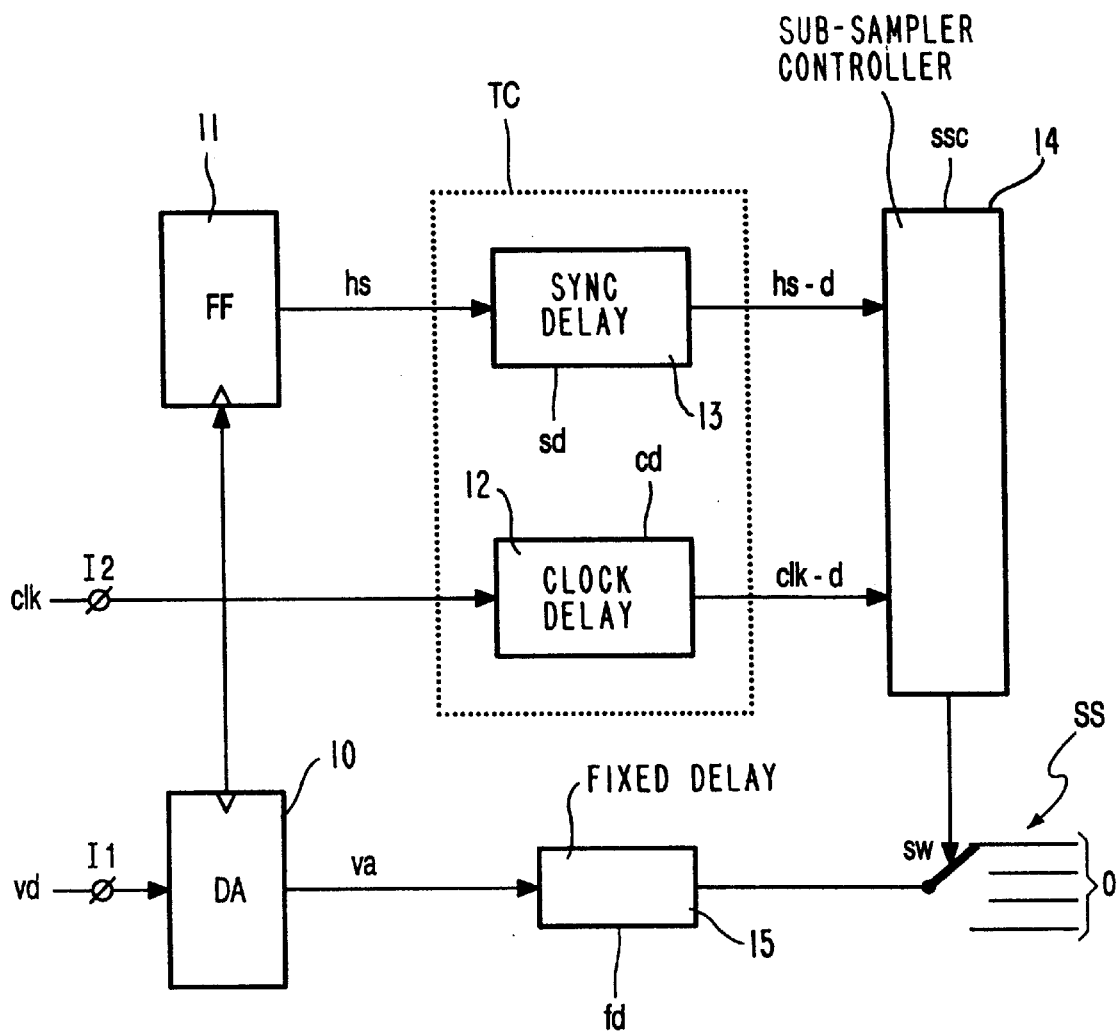
FIG. 1 is a block schematic example of an apparatus for delaying a clock signal.

FIG. 1 shows schematically an example of a timing circuit TC as can be used in a video-processing device of a LCD projection device. At an input i1 a digital video signal vd is received. This digital video signal is supplied to a D/A converter 10, which D/A converter supplies an analog video signal Va. The output of the D/A converter is coupled to a fixed delay device (fd) 15. In this example the fixed delay device fd represents the delay resulting from functions like gamma, contrast, gain adjustment, etc. as normally performed on the analog video signal. The output of the fixed delay device is coupled to a sub-sampler SS, which sub-sampler forms the output O. At another input I2 a clock signal clk is received. This clock signal is supplied as a clock signal to the D/A converter 10, to a flip-flop 11 and as an input signal to the timing circuit TC. At the other input the timing circuit receives a signal hs, in this example a horizontal sync signal from the flip-flop 11. The timing circuit TC comprises a clock delay (cd) 12 and a sync delay (sd) 13 and supplies at its outputs a delayed clock signal clk-d and a delayed sync signal hs-d. These two output signals are supplied to a sub-sampler controller (ssc) 14, which sub-sampler controller controls the switching over of the switch sw of the sub-sampler ss. Every clock cycle the sampling switch sw changes one position. Although the input of the sub-sampler is analog it does not mean that there are no requirements with relation to the clock phase of the sub-sampler's clock. To obtain the best picture, the sampling phase of the sub-sampler's clock needs to be correct with relation to the eye pattern of the analog signal. For this reason the clock of the D/A converter DA needs to be delayed. This means that the control signals that control the sub-sampler controller ssc are also delayed by the same amount. The control signals of the sub-sampler must be synchronized every line. It is assumed that the horizontal input sync pulse is a digital signal that can be clocked with CKD in order to synchronize the digital circuitry with pixel accuracy. In order to synchronize the digital circuitry that is running on the delayed clock, it also necessary to delay the horizontal synchronization pulse hs. The delay should be chosen such that valid, set up and hold times are obtained when hs-d is clocked with clk-d.

Figure 2:
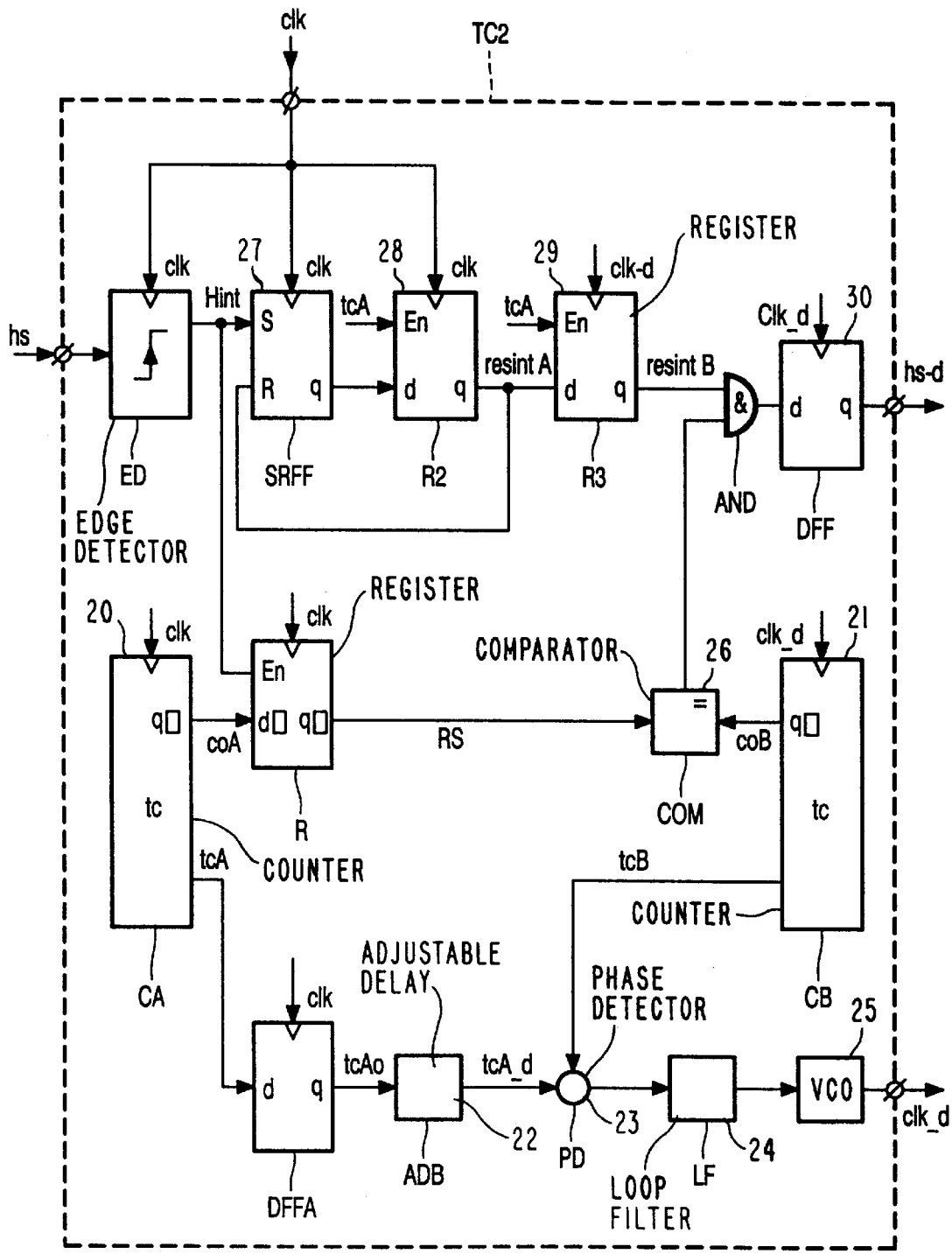
FIG. 2 is a block schematic example of a timing circuit in more detail.

Due to tolerances of the fixed delay in the analog path and in the situation in which a variable clock frequency is used, it is not always possible to use a fixed delay for the clock and sync delay. In FIG. 2 the timing circuit with the clock delay is shown in more detail and will be described hereinafter.

Figure 3:
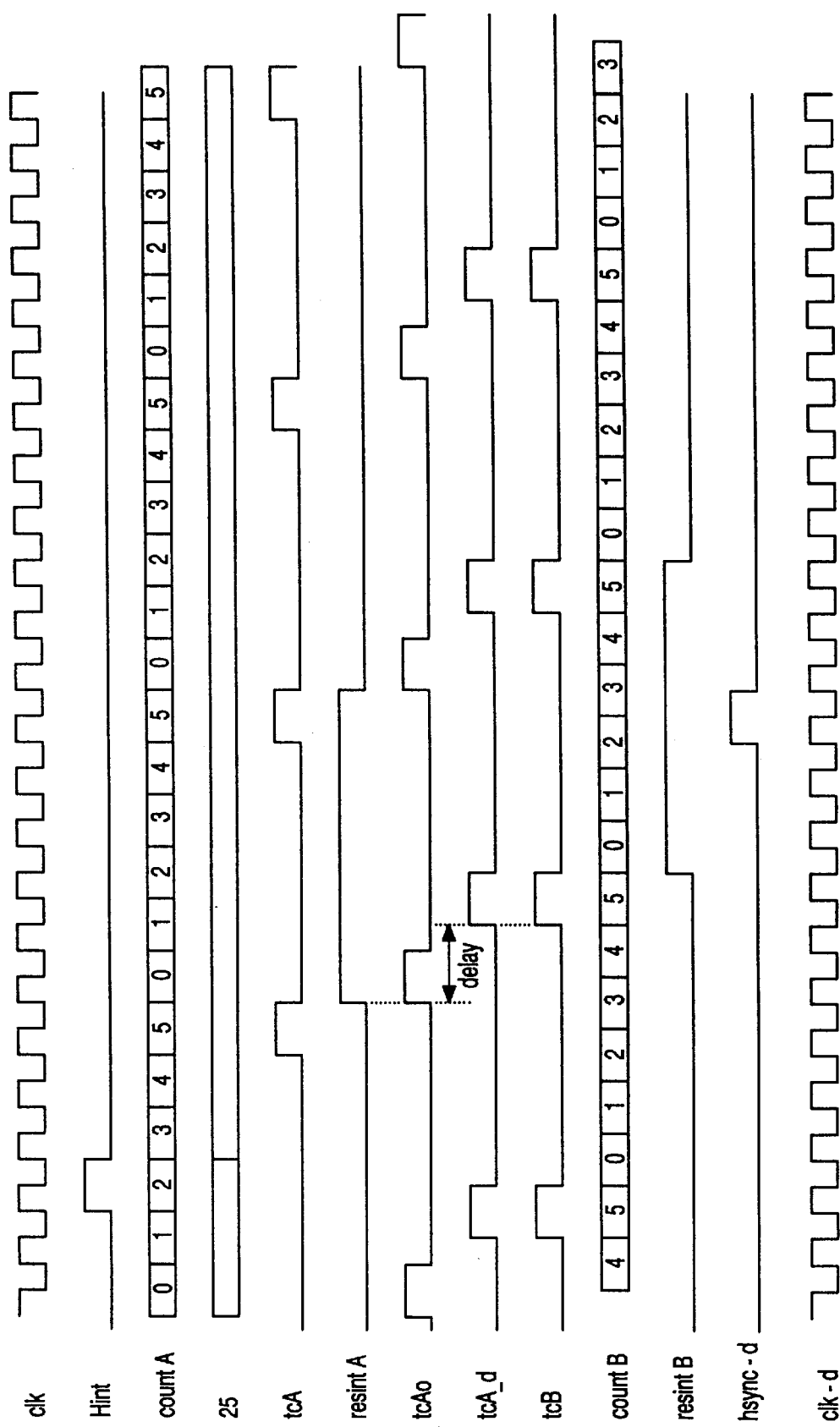
FIG. 3 is a timing diagram of the timing circuit of FIG. 2.

FIG. 2 shows a timing circuit TC2 having two input signals, a clock signal clk and a synchronization signal hs. The timing circuit TC2 supplies a delayed clock signal clk-d and a delayed synchronization signal hs-d. This delayed synchronization signal can be used to synchronize other circuitry running on the delayed clock clk-d. To explain the timing circuit TC2 a timing diagram as shown in FIG. 3 will be used. In this example of the timing circuit TC2 two counters are used. A first counter (CA) 20 is running on a clock signal clk where a second counter (CB) 21 is running on the delayed clock signal clk-d. In this example the counters count up to five and are reset again. The terminal count tcA of counter CA is delayed by an adjustable delay block (ADB) 22 resulting in a signal tcAd. Next a PLL (comprising a phase detector (PD) 23, a loop filter (LF) 24 and a voltage control oscillator (VCO) 25 controls the phase of the delayed clock signal clk-d such that a rising edge of the terminal count tcb of the second counter CB coincides with the rising edge of the signal tc-A-d. With respect to the terminal count tcB the states of the counter CB are fixed. In this way the two counters are synchronized in such a way that the state of counter CB is a delayed version of the state of counter CA. This means that also the output clock clk-d is a delayed version of the input clock clk.

There are various methods to realize a delay between the terminal count signal tcAo of counter CA and the terminal count tcB of counter CB. One possibility is to use existing delay devices. A number of count stages of counter CA and counter CB can however be chosen such that the frequency of the signal tcAo is not out of the range of the delayed device anymore. Another way to realize the delay is to modify the PLL itself, such that the PLL itself introduces the desired delay. In that way no dedicated delay device is necessary anymore.

Apart from the clock signal the circuitry also delays the reference signal hs by the same amount, which result in a delayed reference signal hs-d. A rising edge of signal hs is determined by an edge detector ED (h int).

The state of countA at the moment of the rising edge of hs is stored in the register R1 (res-state). The output of the register R1 supplies a signal rs to a comparator (COM) 26. At the other input the comparator receives the signal countB from the counter CB.

Next a count interval is defined as the interval in which the counters CA and CB count from zero to their maximum value (in this example 5). The signal resintA indicates the interval just after the interval in which a rising edge of hs was detected. The signal resintb then indicates the corresponding interval for counter CB. The signal resintB is thus a delayed version of resintA where the delay is identical to the delay of the clock signal. Next, when resintB is high and the state of counter CB is equal to the res-state, the signal hs-d goes high. In this way the delayed synchronization signal is obtained that undergoes the same delay as the clock itself when the delay changes.

The signal hint is also supplied to a SR flip-flop (SRFF) 27. The output of the SR flip flop 27 is coupled to a second register (R2) 28. The output supplying the signal resintA of the register R2 is coupled to the reset input of the SR flip-flop SRFF. The output is further coupled to a third register (R3) 29 supplying the signal resintB. The output of the register R3 is coupled to an AND gate AND. At the other input the AND gate receives an output signal from the comparator COM. The output of the AND gate is coupled via a D flip-flop 30 to the output of the timing circuit TC2 for supplying the signal hs-d.

It is to be noticed that in the discussion above a timing circuit and a method of the invention has been described on the basis of an example. Persons skilled in the art will be well aware of a lot of variations, which fall within the scope of the present invention.

What is claimed is:

1. A timing circuit comprising: an input for receiving an input timing signal, adjustable delay means for delaying the input timing signal and an output for supplying a delayed output timing signal, characterized in that the adjustable delay means comprise counting means for counting the input timing signal and the delayed output timing signal, wherein the timing circuit comprises a second input for receiving a second input signal, and means for delaying the second input signal with the same delay as the input timing signal, and which delaying means supply at a second output a second delayed output signal.

2. A timing circuit as claimed in claim 1 wherein the means for delaying the second input signal is under control of the input timing signal and the second delayed output signal whereby the second delayed output signal has the same delay as that of the delayed output timing signal.

3. A timing circuit as claimed in claim 1 wherein the second input signal and the second delayed output signal are an input synchronizing signal and a delayed output synchronizing signal, respectively, wherein the delayed output synchronizing signal has the same delay as that of the delayed output timing signal.

4. A display device for displaying an image comprising a timing circuit comprising: an input for receiving an input timing signal, adjustable delay means for delaying the input timing signal and an output for supplying a delayed output timing signal, characterized in that the adjustable delay means comprise counting means for counting the input timing signal and the delayed output timing signal, and a circuit for processing an image signal controlled at least in part by the delayed output timing signal of said timing circuit.

5. A method of adjustably delaying an input timing signal comprising: receiving an input timing signal, adjustably delaying the input timing signal and supplying a delayed output timing signal, characterized in that the adjustable delaying comprises counting the input timing signal and the delayed output timing signal, which method further comprises:

receiving a second input signal, adjustably delaying the second input signal with the same delay as the input timing signal, and supplying a second delayed output signal.

6. A method as claimed in claim 5 which further comprises:

adjustably delaying the second input signal under control of the input timing signal and the delayed output timing signal.

7. A timing circuit comprising: an input for receiving an input timing signal, adjustable delay means for delaying the input timing signal and an output for supplying a delayed output timing signal, characterized in that the adjustable delay means comprise counting means for counting the input timing signal and the delayed output timing signal, wherein the counting means comprise:

a first counter with a fixed count for counting the input timing signal, a second counter with the same fixed count as that of the first counter for counting the delayed output timing signal, and the adjustable delay means further comprise means controlled by outputs of the first and second counters for deriving said delayed output timing signal.

8. A timing circuit comprising: an input for receiving an input timing signal, adjustable delay means for delaying the input timing signal and an output for supplying a delayed output timing signal, characterized in that the adjustable delay means comprise counting means for counting the input timing signal and the delayed output timing signal, and further comprising:

a circuit for processing an input signal, said processing circuit having a delay to which said adjustable delay means adjusts in order to derive the delayed output timing signal with the same delay as that of the processing circuit, and means for controlling the processing circuit on the basis of the delayed output timing signal.

9. A timing circuit as claimed in claim 8 wherein the timing circuit comprises a second input for receiving an input synchronizing signal, and means for delaying the input synchronizing signal with the same delay as the input timing signal thereby to derive at a second output a delayed output synchronizing signal with the same delay as that of the delayed output timing signal.

10. A timing circuit as claimed in claim 8 wherein a change in delay of the processing circuit causes the timing circuit to adjust its delay correspondingly, wherein the timing circuit comprises a second input for receiving an input synchronizing signal and comprises a second output, and means for delaying the input synchronizing signal with the same delay as the input timing signal whereby at the second output, a delayed output synchronizing signal is derived with the same delay as that of the delayed output timing signal and corresponding to the change in delay of the processing circuit.

11. A timing circuit comprising: an input for receiving an input timing signal, adjustable delay means for delaying the input timing signal and an output for supplying a delayed output timing signal, characterized in that the adjustable delay means comprise counting means for counting the input timing signal and the delayed output timing signal, and wherein the counting means comprise:

a first counter for counting the input timing signal, a second counter for counting the delayed output timing signal, and the adjustable delay means include means for synchronizing the first and second counters so that the count in the second counter is a delayed replica of the count in the first counter.

12. A timing circuit comprising: an input for receiving an input timing signal, adjustable delay means for delaying the input timing signal and an output for supplying a delayed output timing signal, characterized in that the adjustable delay means comprise counting means for counting the input timing signal and the delayed output timing signal, and wherein an initial count of the counting means is independent of the desired delay of the delayed output timing signal.

13. A timing circuit comprising: an input for receiving an input timing signal, adjustable delay means for delaying the input timing signal and an output for supplying a delayed output timing signal, characterized in that the adjustable delay means comprise counting means for counting the input timing signal and the delayed output timing signal, and which further comprises a second input for receiving a second input signal and comprises a second output, and second adjustable delay means for delaying the second input signal with the same delay as that of the input timing signal thereby to supply at the second output a second delayed output signal.

* * * * *